United States Patent [19]

Gross, Jr. et al.

[11] Patent Number: 5,489,905
[45] Date of Patent: Feb. 6, 1996

[54] MERGED DECODING CIRCUIT FOR ANALOG-TO-DIGITAL FLASH CONVERSION

[75] Inventors: George F. Gross, Jr., Reading; Thayamkulangara R. Viswanathan, Albany Township, Berks County, both of Pa.

[73] Assignee: AT&T Corp., Murray Hill, N.J.

[21] Appl. No.: 163,956

[22] Filed: Dec. 8, 1993

[51] Int. Cl.⁶ .................................................. H03M 1/36
[52] U.S. Cl. .................................................. 341/160
[58] Field of Search .................................. 341/156, 158, 341/159, 160

[56] References Cited

U.S. PATENT DOCUMENTS

| | | | |
|---|---|---|---|
| 4,737,766 | 4/1988 | van de Plassche | 340/347 |
| 4,860,011 | 8/1989 | Colles | 341/133 |
| 4,958,157 | 9/1990 | Miki et al. | 341/159 |
| 5,237,326 | 8/1993 | Jeong et al. | 341/160 |
| 5,260,706 | 11/1993 | Chung | 341/160 |

FOREIGN PATENT DOCUMENTS

0259936A2  3/1988  European Pat. Off. .

*Primary Examiner*—Howard L. Williams

[57] ABSTRACT

A circuit for conversion of an analog input signal to a digital representation of the analog signal. The circuit is typically employed in flash technology, since it is able to produce the digital representation of the analog signal faster and more efficiently than conventional flash converters. The circuit includes a plurality of resistors serially coupled between two reference voltages to form a plurality of nodes therebetween. A plurality of comparators, each having a first input coupled to one of the plurality of nodes and a second input coupled to the analog input signal. Accordingly each comparator compares the analog input signal to a voltage potential at one of the nodes to generate first and second complementary output signals at the outputs of the comparators. The complementary outputs are then applied to a decode circuit having a plurality of digital output lines and switches directly coupled to the digital output lines. The decode circuit exploits a numerical characteristic of digital numbering systems to reduce the amount of hardware required, and as a result achieves improved performance. The first and second complementary outputs switch the digital output lines to a first or second logic state in response to the first and second complementary output signals, thereby producing the digital representation of the analog input signal.

5 Claims, 4 Drawing Sheets

MERGED DECODING CIRCUIT FOR ANALOG-TO-DIGITAL FLASH CONVERSION

BACKGROUND OF THE INVENTION

1. Field of the Invention

The present invention relates generally to conversion of analog signals to digital signals, and more particularly to a merged decoding circuit for analog-to-digital flash conversion.

2. Related Art

As the word "flash" implies, flash converters are employed to achieve high speed conversion of analog signals to digital signals. Flash converters yield a conversion of analog-to-digital signals in approximately one clock cycle. There are many ways to perform analog-to-digital conversion, but flash converters are typically the fastest architecture available. To understand how flash converters operate and the problems associated with conventional flash converters, the following example is presented.

FIG. 1 is a high-level block diagram of an example standard flash converter 100. The flash converter 100 consists of two stages: a decoder 102 and a Read Only Memory (ROM) 104. The flash converter 100 generally operates as follows. An analog input signal is received by the decoder 102 via a bus 101. The decoder 102 compares the analog input signal to a reference voltage located within tile circuitry (to be described below) of the decoder 102. The decoder then generates a decoded value representing the voltage level of the analog signal and passes the decoded value to the ROM 104 via a bus 103. The internal architecture of the ROM 104 is comprised of standard ROM circuitry. After receiving the decoded value the ROM 104 generates a digital value associated with the decoded value via a bus 105.

As will become more apparent from the detailed example below, there are many problems associated with standard flash converters, such as a flash converter 100. For instance, the two stage philosophy shown in FIG. 1 requires too much power, too much area on an integrated circuit chip, and is too slow for certain applications.

FIG. 2 is a more detailed example of flash converter 100. FIG. 2 is the same as FIG. 1, but includes a view of the detailed circuitry located within the decoder 102. The decoder 102 includes: a resistor string comprising a plurality of serially connected resistors 202A–202n (where n can be any number); a thermometer 204 comprising a plurality of comparators 206A–206n; and a decode tip 210 comprising a plurality of AND gates 208A–208(n–1) having outputs 209A–209(n–1).

A reference voltage ($V_{REF}$) is applied to the top of the resistor string and the bottom of the resistor string is grounded. Alternatively, a positive reference voltage ($V_{REF+}$) is applied to the top of the resistor string and a second voltage ($V_{REF-}$), less positive than $V_{REF+}$, is applied to the bottom of the resistor string 202. Accordingly, a different voltage potential is established between each resistor 202A–202n at a plurality of nodes 205A–205n. Each one of the resistor nodes 205 is coupled to a corresponding comparator 206. The analog input signal is also input to each comparator 206 via the bus 101. In this manner, the analog input signal can be compared with the respective voltages at nodes 205A–205n. The comparators 206A–206n generate an inverted output ($20\overline{7A}$–$20\overline{7n}$) and a non-inverted output (207A–207n) based upon the comparison of the input signal 101 with the respective voltage at nodes 205A–205n.

The series of comparators 206 are referred to as the thermometer 204, because they act like a mercury thermometer. In other words, the analog input voltage can range somewhere between the potential of nodes 205A and 205n.

If, for example, the voltage lies between nodes 205D and 205E, then all comparators from comparator 206D and below (e.g., 206C, 206B and 206A) generate a logic 1 at the non-inverting output 207A–D of each respective comparator 206A–D. This indicates that the analog input voltage signal 101 is greater than the respective voltages at nodes 205A–D. At comparator 206E, the input voltage is actually less than the voltage at node 205E. Therefore, all comparators from comparator 206E to 206n will produce a logic 0 at the non-inverted outputs 207E–n of thermometer 204. The outputs 207 of comparators 206 produce what is referred to as the "thermometer code."

The thermometer code via 207 is then decoded by a series of AND gates 208, which comprise the decode tip 210. Each non-inverting output, with the exception of n, is ANDed with the inverting output of the adjacent, next highest thermometer code comparator. AND gate 208A ANDs output A and $\overline{B}$, AND gate 208B ANDs output B and $\overline{C}$, ... and AND gate 208(n–1) ANDs output n–1 and $\overline{n}$.

If comparators 206A–206D all produce a logic 1 and comparators 206E–n all produce a logic 0 at the non-inverted outputs of the comparators 206, then the outputs are as follows: A, B, C and D are all logic 1 and $\overline{B}$, $\overline{C}$ and $\overline{D}$ are all logic 0. Accordingly, AND gate 208A produces a logic 0 at output 209A. AND gate 208B produces a logic 0 at output 209B. Similarly, AND gate 208C produces a logic 0 at output 209C.

However, in this example, comparator 206D produces a logic 1 at output D, and comparator 206E produces a logic 0 at non-inverted output E and logic 1 at inverted output $\overline{E}$. Therefore, AND gate 208D produces a logic 1 at the output 209D. This is referred to as "decoding the tip" of the thermometer code. Only one output 209A–209(n–1) will be a logic 1.

This output is then fully decoded by the ROM 104 in a conventional manner, that, in this example, generates an appropriate n-bit output on bus 105 after receiving the code via bus 103 (which comprises outputs 209A–209(n–1)). This is the way a standard flash converter 100 operates.

The number of bits output by the flash convertor 100 via the bus 105 determines how many comparators 206 are employed. So for an M-bit converter 100, there are in general, $2^M+1$ comparators 206. This allows detection of M bits plus underflow and overflow. In specific applications, where underflow and overflow detection is not required, $2^M-1$ comparators are used. As M increases, the number of comparators increases exponentially. Thus, the chip area becomes large and the power requirements increase for the comparators and AND gates. It is, therefore, rare for flash converters 100 to exceed more than eight-bits at the bus 105. In addition, the multi-step conversion process described above has several levels of gate delays. Accordingly, the multi-stage conversion process is time consuming, costly in terms of area on the chip and consumes too much power for the required process involved.

Therefore, what is needed is a flash converter that: (1) is able to operate faster than current flash converters (e.g., less gate delays and latency); (2) requires less power than current flash converters; and (3) requires less area on a chip.

SUMMARY OF THE INVENTION

The present invention is directed to a flash converter circuit for conversion of an analog input signal to a digital representation of the analog signal. The circuit is able to produce the digital representation of the analog signal faster and more efficiently than conventional flash converters.

The circuit includes a plurality of resistors serially coupled between a reference voltage and ground to form a plurality of nodes therebetween. A plurality of comparators, each having a first input coupled to one of the plurality of nodes and a second input coupled to the analog input signal, compares the analog input signal to a voltage potential at one of the nodes to generate first and second complementary output signals at the outputs of the comparators.

The complementary outputs are then applied to a decode circuit having a plurality of digital output lines and switches directly coupled to the digital output lines. The first and second complementary outputs from the comparators switch the digital output lines to a first or second logic state in response to the first and second complementary output signals, thereby producing the digital representation of the analog input signal.

In an example embodiment of the present invention, an analog input signal is converted to a four bit digital signal representing the digital equivalent of the analog signal. First, a fixed reference voltage is applied to a resistor string generating a unique set of voltages at each resistor node. Then, the analog input signal is compared to this set of voltages by a series of comparators having both normal and complimentary outputs. The comparators produce a thermometer code (of normal and complementary outputs) indicative of the analog input voltage. The thermometer code is then directly applied to a decoding circuit having combinatory logic made-up of CMOS technology transistors.

The merged decoding circuit is connected to the comparators such that the most significant bit (MSB) position wire is connected directly to one of the comparator outputs. Thus, the MSB wire is directly controlled by one of the comparators outputs. For example, if the particular comparator output is logic 1, then the MSB is logic 1 or visa vera if the output is logic 0.

The rest of the bit positions have N-channel switches and P-channel switches connected to each output wire. The normal and complementary outputs from the comparators are connected to the N-channel and P-channel switches. The thermometer code causes each output wire of the merged decoding circuit to be either pulled-up to $V_{DD}$ (P-channel switches) or pulled-down to ground (N-channel switches). The combinatory logic is connected to outputs from the comparators in a manner to produce the correct logical expressions for each output wire.

Features and advantages of the present invention are: (1) increased speed of conversions, since the desired digital output is generated in one step; (2) less transistors are required and therefore path delays for the desired digital output are reduced; and as a result of one and two, (3) a reduction in chip area and also a reduction in power consumption.

Further features and advantages of the present invention, as well as the structure and operation of various embodiments of the present invention, are described in detail below with reference to the accompanying drawings.

DETAILED DESCRIPTION OF THE PREFERRED EMBODIMENTS

Figure 1:
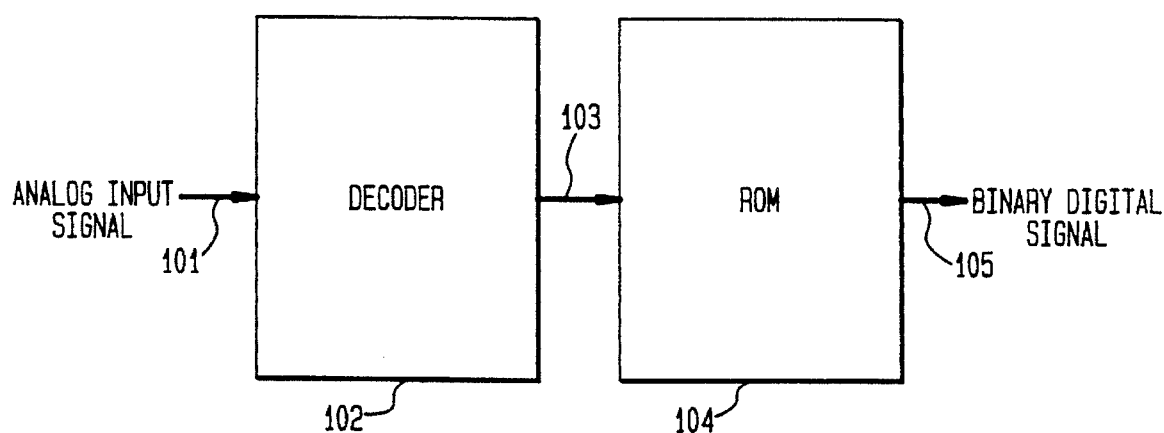
FIG. 1 is a high-level block diagram of a conventional flash converter 100.
Figure 3:
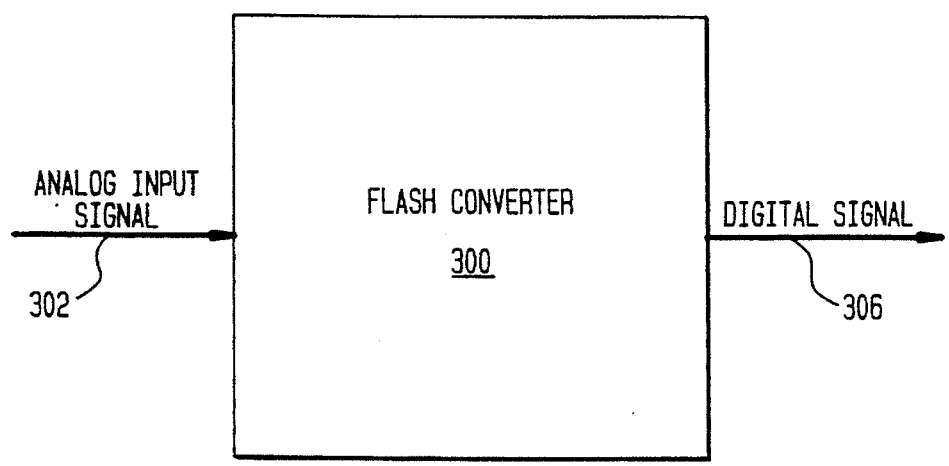
FIG. 3 is a high-level block diagram of a flash converter 300 according to the preferred embodiment of the present invention.
Figure 2:
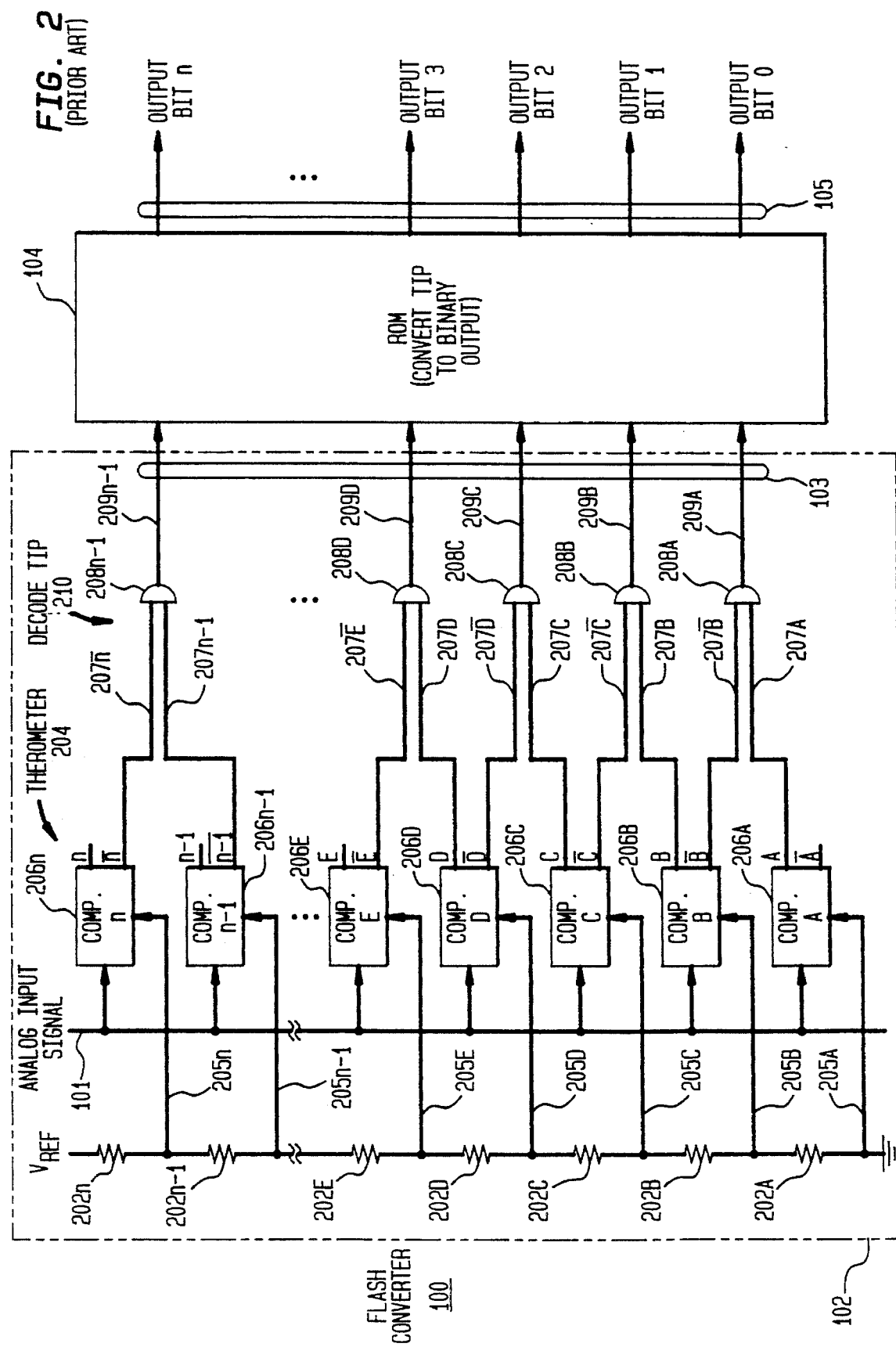
FIG. 2 is a more detailed example of the flash converter shown in FIG. 1.

FIG. 3 is a high-level block diagram of a flash converter 300 according to the preferred embodiment of the present invention. The flash converter 300 comprises one stage instead of two stages, compared to the conventional flash converter 100 of FIGS. 1 and 2.

Referring to FIG. 3, the flash converter 300 of the present invention eliminates the need to: (1) convert analog data into decoded thermometer data and (2) employ the decoded thermometer data to read information stored in a ROM to produce the final digital signal. Instead only one function needs to be performed: converting analog data into digital data, that simultaneously decodes the digital thermometer data into a decoded digital signal.

Figure 4A:
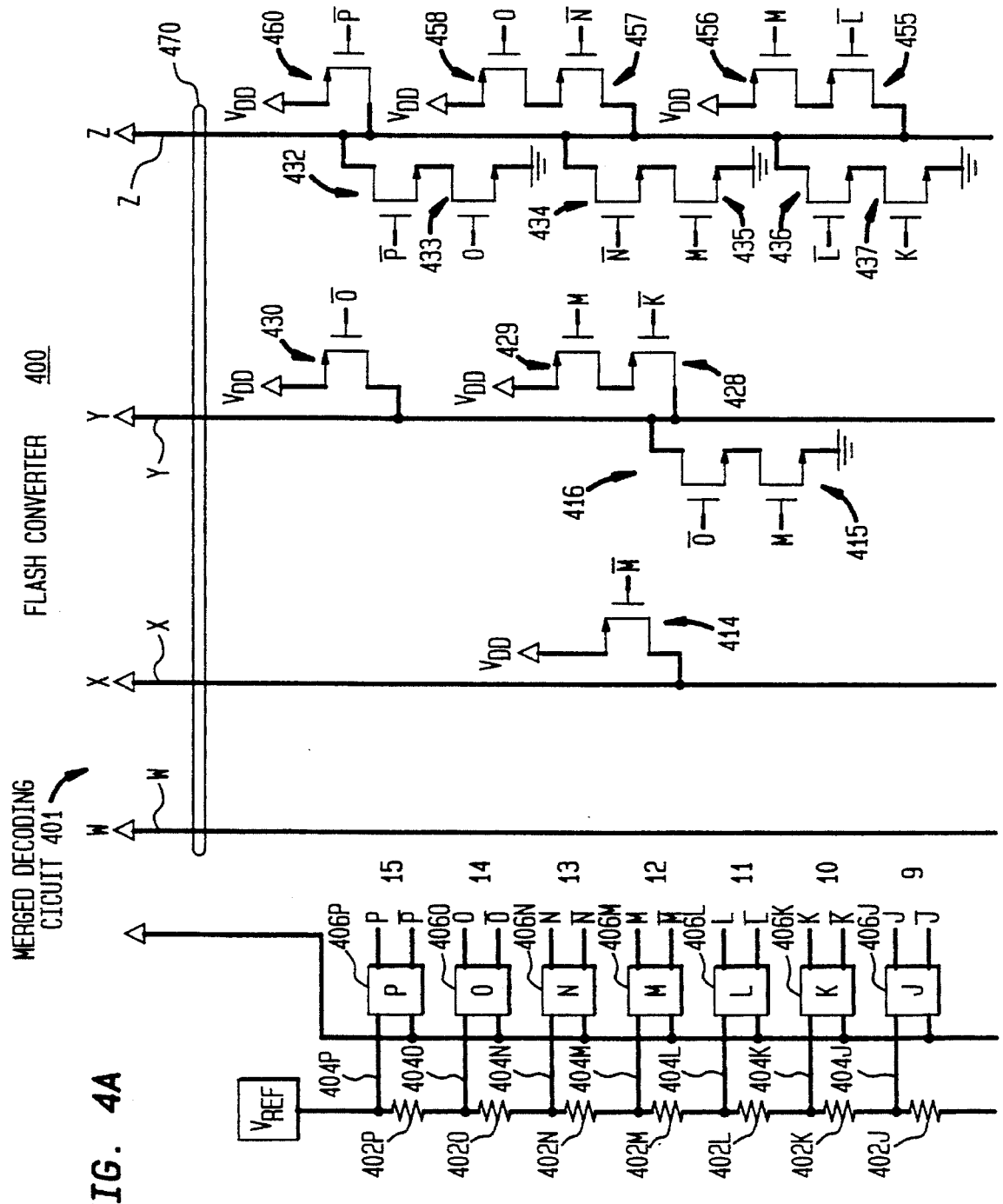
FIG. 4 is an example circuit diagram of 4-bit flash converter 400 according to the preferred embodiment of the present invention.
Figure 4B:
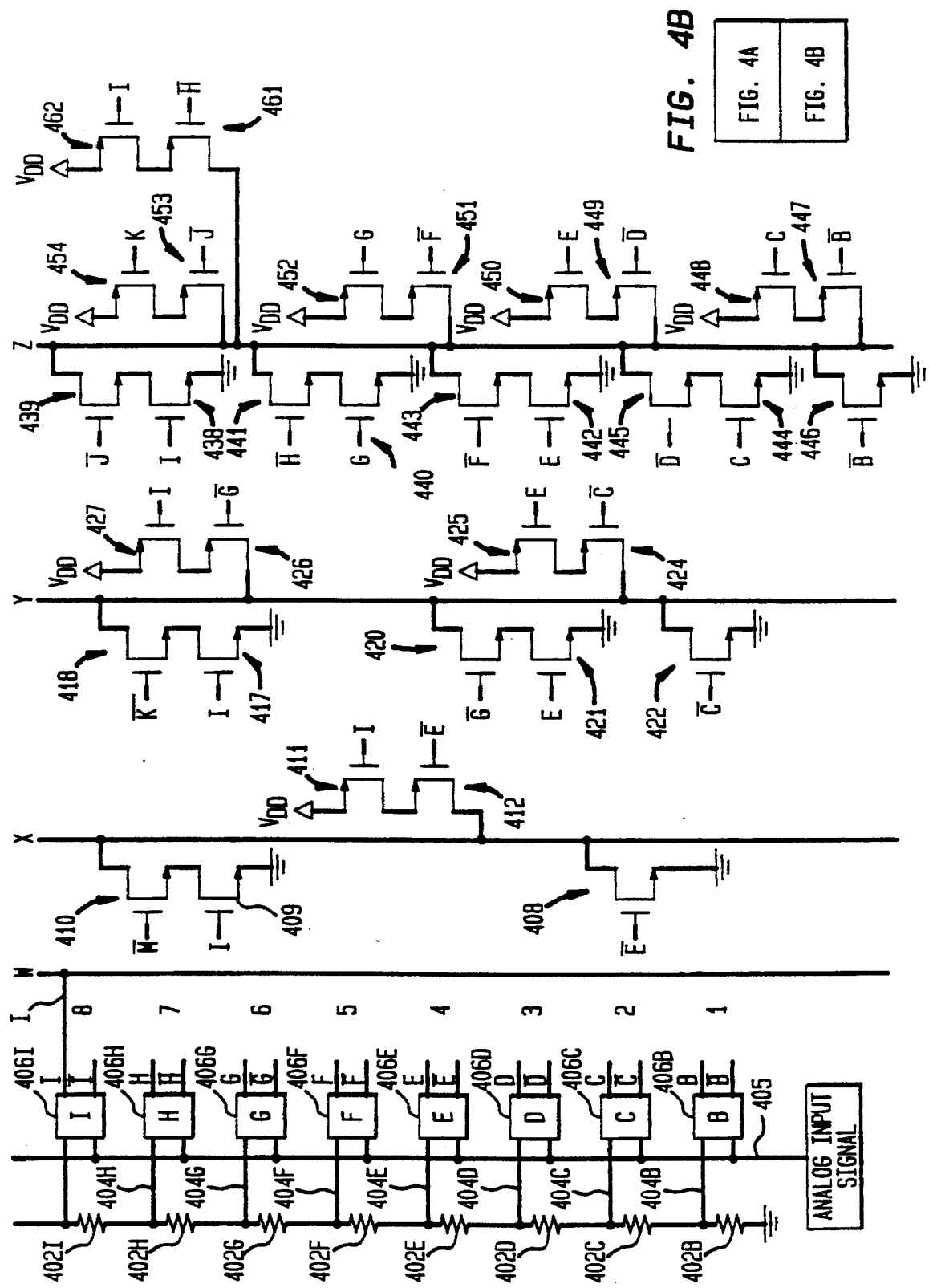

The present invention combines the conversion circuitry of conventional technology with decode circuitry called "merged decoding circuitry" to be described below with reference to FIG. 4. As a result, the present invention is faster and requires less area (e.g., chip real estate) than conventional flash converter 100. As will become more apparent below, flash converter 300 also uses less power than conventional flash converter 100.

In the preferred embodiment, flash converter 300 is implemented using CMOS (Complementary Metal Oxide Silicon) technology. CMOS technology is advantageous because digital CMOS circuits do not use power (i.e., sink current from the power supply) except when they are changing state. Although implemented in CMOS, the present invention can be implemented in other technologies (e.g., NMOS, CBIC, etc.)

Operation and internal circuitry of the flash converter 300 will be described with reference to FIG. 4. FIG. 4 is a representative circuit diagram of an example 4-bit flash converter 400 according to the preferred embodiment of the present invention. FIG. 4 is essentially the same as FIG. 3, but includes a detailed view of the circuitry located within the flash decoder 300.

Referring to FIG. 4, the flash converter 400 includes: a merged decoding circuit 401, a resistor string 402, and comparators 406. The merged decoding circuit 401 includes CMOS logic circuits 408–462.

The flash converter 400 of the present invention generally operates as follows. An analog input signal 405 is received by comparators 406 and compared to node voltages 404 generated on a resistor string 402. The comparators 406 generate digital outputs (labeled as B through P and $\bar{B}$ through $\bar{P}$) representing the voltage level of the analog input signal 405. It should be noted that node voltages can be generated by other means than a resistor string (e.g., n separately generated reference voltages, a charged capacitor array with n output levels available, etc.).

The digital outputs from the comparators 406 are connected to combinatorial logic circuits 410–462. After receiving digital outputs B–P and $\bar{B}$–$\bar{P}$, the combinatory logic circuits 410–462 directly generate a converted digital signal indicating the digital equivalent of the analog input signal 405 via a bus 470. The bus 470 comprises four lines W, X, Y and Z of the output of flash converter 400, where W is the most significant bit (MSB) and Z is the least significant bit (LSB) of bus 470.

N-type channel CMOS transistors are shown on the left hand side of lines X, Y and Z and P-type channel CMOS transistors are shown on the right hand side of lines X, Y and Z. Combinatory logic circuits 410–462 generate a digital output on bus 470, by pulling-up (producing a logic 1 ) and/or pulling-down (producing a logic 0) wires W, X, Y and Z. The P-type transistors perform the pull-up function and the N-type transistors perform the pull-down functions depending on the logic levels of the digital outputs B–P and B̄–P̄ from the comparators 406, as shown in FIG. 4.

The speed of flash converter 400 is primarily limited by the speed of comparators 406. Flash converter 400 can employ the same resistor string 402 and comparators 406 as employed in conventional flash converters, shown in FIG. 2 and described above.

The structure of the merged decoding circuit 401 will now be described in more detail. It should be understood that this example is described with reference to a 4-bit offset binary converter, but could easily be modified to convert in other digital codes (Hexadecimal, 2's compliment, sign magnitude, etc.) or other number binary converters (e.g., 6-bit, 8-bit, etc.) as would become apparent to those skilled in the art.

THE MOST SIGNIFICANT BIT POSITION, LINE W

The output I of comparator 406I is connected to line W, such that the most significant bit position, generates the logical value produced by comparator 406I's non-inverted output I. Thus, W=output I. If the analog input signal 405 is greater than or equal to the mid point node voltage of reference resistors 402, then the MSB W assumes a logic 1, because the output I of comparator 406I is a logic 1. This condition remains in affect for any voltage greater than ½$V_{REF}$. And likewise values less than ½$V_{REF}$ cause converter 406I to generate a logic zero at output I and therefore the MSB will be a logic zero.

OUTPUT LINES X–Z: GENERAL OPERATION

Merged decoding circuit 401 utilizes one- and two-input switches to produce the correct digital output on output lines X–Z. A one-input switch refers to a single transistor, either N-type or P-type, connecting the output line either to $V_{DD}$ or ground, with the single input applied to the transistor gate. A two-input switch refers to two transistors connected in series, connecting the output line either to $V_{DD}$ or ground, with one input applied to either transistor gate, and the second input applied to the remaining transistor gate. The N-type switches close when a logic 1 is applied to the single input of a one-input switch, or to both inputs of a two-input switch. Since the N-type switches are connected between the output line and ground, closing the switch results in a logic 0 output. Similarly, the P-type switches close when a logic 0 is applied to the single input of a one-input switch, or to both inputs of a two-input switch. Since the P-type switches are connected between $V_{DD}$ and the output line, closing the switch results in a logic 1 output.

The switches are arranged on output lines X–Z according to the same general strategy, as described below. As the thermometer code rises (e.g., a rising four bit thermometer code: 0000, 1000, 1100, 1110, 1111) in response to the rising analog input voltage, the digital output must correspondingly track the input by increasing the numeric value represented on output lines W–Z. The preferred embodiment describes analog to binary conversion, but the same general strategy applies equally well to other digital codes.

The decode circuit exploits the fact that as the binary counting sequence increases, each bit must periodically alternate between a logic 0 and logic 1. The period at which each bit alternates increases as the order of the bit increases (i.e., the least significant bit alternates at the shortest period, the most significant bit the longest). For each output line, a different switch holds the line at the appropriate logic state for the duration of each period. For the first and last periods, a one-input switch suffices; for the intervening periods, a two-input switch is required. For example, the merged decoding circuit 401 of FIGS. 4A & 4B uses N-type one-input switch 408 to hold output line X at logic 0 until the thermometer code reaches the fourth comparator. At this point the comparator output E goes high, the complementary output goes low which opens switch 408 and closes one input of the two-input switch 411/412. The second input I is already low, and remains low until the thermometer code reaches the eighth comparator. During this period both inputs are low, causing switch 411/412 to close and holding output line X at logic 1.

The remaining switches on output line X work in similar fashion, holding the output at logic 0 and logic 1 for the remaining two periods. Output lines Y and Z are similarly configured, the only difference being that the periods are shorter and therefore more transistors are required.

Merged decoding circuit 401 realizes a savings in transistors by exploiting this numerical characteristic of the binary code. A single switch is required to hold a given output line at the appropriate value over a single period. Since the period increases with increasing bit order, and since the length of the thermometer code is fixed, output lines corresponding to higher order bits require successively fewer switches. For binary code, the number of periods per output line may be expressed as $2^{N-k}$, where N is the total number of output lines, or bits, and k is the order of the output line (0, 1, . . . , N–1). The present invention may be implemented by a total number of transistors given by:

$$\sum_{k=0}^{N-2} (2^{(N-k+1)} - 2).$$

This implementation requires fewer transistors than past analog-to-digital flash converters, resulting in a circuit that requires less space, is faster, and consumes less power.

Similar numerical characteristics appear in other numbering systems, such as 2's complement, Hexadecimal, and sign magnitude, and may be exploited in similar fashion. Thus, the present invention describes a circuit methodology for the efficient transformation of analog signals into a variety of digital codes.

THE NEXT HIGHEST SIGNIFICANT BIT POSITION, LINE X

After MSB W, line X is the next highest significant binary bit position such that line X changes state every 4-times in the binary counting sequence as the voltage of analog input signal 405 increases. To produce this binary counting sequence, combinatory logic circuits 408, 409, 410, 411, 412, and 414 are connected to line X. On the left hand side of line X are N-type transistor switches (N-switches) 408, 409, and 410 and on the right-hand side of line X are P-type transistor switches (P-switches) 411, 412 and 414. P-switches 411, 412 and 414 handle all logic 1 conditions for line X, because P-switches 411–414 singularly or in combination pull-up line X to $V_{DD}$ when turned-on.

N-switches 408, 409 and 410 handle all logic 0 conditions, because they singularly or in combination pull-down line X to ground when turned-on. For example, if the analog input signal 405 is less than ¼ of $V_{REF}$, corresponding to final converted digital outputs 0000, 0001, 0010, 0011 for the 4-bit converter example, then all non-inverted outputs from comparators 406E-to-406P are zero. Thus, output $\bar{E}$ causes N-switch 408 to turn-on and pull line X to ground, which causes line X to assume a logic zero.

On the other hand, if the analog input signal 405 is equal to ¼$V_{REF}$, corresponding to converted digital output 0100 for a 4-bit converter, then P-switches 411 and 412 turn-on causing X to be pulled up to $V_{DD}$ and therefore to assume a logic 1.

Similarly, it can be shown that unique combinations of switches exists to decode line X for all levels of the analog input signal 405.

THE NEXT HIGHEST SIGNIFICANT BIT POSITION, LINE Y

Line Y is the next highest significant binary bit position in which line Y changes state every two times in the binary counting sequence as the voltage of analog input signal 405 increases. To produce this binary counting sequence, connected to line Y are combinatory logic circuits 415, 416, 417, 418, 420, 421, 422, 424, 425, 426, 427, 428, 429, and 430. On the left hand side of line Y are N-switches 415–422 and on the right-hand side of line Y are P-switches 424–430.

N-switches 415–422 singularly or in combination generate the binary logic zero conditions for line Y by pulling the line down to ground. For example, if the analog input signal 405 is less than ⅛$V_{REF}$, corresponding to final converted digital outputs 0000 and 0001 for a 4-bit converter, then all outputs from comparators 406C-to-406P are zero. Thus, output $\bar{C}$ causes N-switch 422 to turn-on, pulling line Y to ground, generating a logic zero.

On the other hand, if the analog input signal 405 is equal to ⅛$V_{REF}$, which is equivalent to binary output 0010 for a 4-bit converter, then P-switches 424 and 425 turn-on causing line Y to be pulled-up to $V_{DD}$ and therefore to assume a logic 1.

Similarly, it can be shown that unique combinations of switches exist to decode line Y for all levels of the analog input signal 405.

THE LEAST SIGNIFICANT BIT POSITION, LINE Z

Line Z is the LSB, which changes state each step in the binary counting sequence as the voltage of the analog input signal 405 increases. To produce this binary counting sequence, connected to line Z are combinatory logic circuits 432, 433, 434, 435, 436, 437, 438, 439, 440, 441, 442, 443, 444, 445, 446, 447, 448, 449, 450, 451, 452, 453, 454, 455, 456, 457, 458, 460, 461, and 462. On the left hand side of line Z are N-switches 432–446 and on the right-hand side of line Z are P-switches 447–460.

N-switches 432–446 singularly or in combination generate the binary logic zero conditions for line Z by pulling the line down to ground. For example, if the analog input signal 405 is less than $\frac{1}{16}V_{REF}$ corresponding to final converted digital output 0000 for a 4-bit converter, all outputs from comparators 406B-to-406P are zero. Thus, output $\bar{B}$ causes N-switch 446 to turn-on, pulling line Z to ground, generating a logic zero. On the other hand, if the analog input signal 405 is equal to $\frac{1}{16}V_{REF}$, corresponding to final converted digital output 0001 for a 4-bit converter, then P-switches 447–448 turn-on causing line Z to pull-up to $V_{DD}$, generating a logic 1.

Similarly, it can be shown that unique combinations of switches exist to decode line Z for all levels of the analog input signal 405.

Thus, the merged decoding circuitry according to the present invention eliminates the ROM of conventional flash convertors. The merged decoding circuitry speeds-up analog-to-digital conversions while using less power and chip area than that required by conventional circuits.

Those skilled in that art will appreciate that the present invention can be practiced by other than the embodiments described, which are present for purposes of illustration and not of limitation, and the present invention is limited only by the claims that follow.

What is claimed is:

1. A circuit for conversion of an analog input signal to a digital representation of the analog signal, comprising:

a plurality of different reference voltages applied to a plurality of nodes;

a plurality of comparators, each having first and second inputs and first and second complementary outputs, each of said first inputs is coupled to one of said plurality of nodes and each of said second inputs is coupled to the analog input signal, wherein each comparator compares the analog input signal to a voltage potential at a corresponding one of said nodes to generate first and second complementary output signals at said first and second complementary outputs, respectively; and a decode circuit having a plurality of digital output lines, a plurality of one-input switches and a plurality two-input switches, said switches of both types directly coupled to said digital output lines and to selected ones of said first and second complementary outputs to switch said digital output lines to a first or second logic state in response to said first and second complementary output signals, thereby producing a digital representation of the analog input signal, wherein the inputs to said one- and two-input switches are arranged to exploit a numerical characteristic of a digital numbering system corresponding to said digital representation, wherein said decode circuit utilizes not more than about $$\sum_{k=0}^{N-2} (2^{(N-k+1)} - 2).$$

transistors, where N is the total number of said digital output lines and k is the order of said digital output lines.

2. The circuit of claim 1, wherein said digital numbering system is binary code, and said numerical characteristic is the periodic transition between a first and second logic state that occurs in each bit of a binary counting sequence.

3. The circuit of claim 2, wherein said decode circuit further comprises:

a most significant bit digital output line directly coupled to the first or second complementary output of a selected one of said comparators; and one or more lower order digital output lines, each of said lower order digital output lines having two of said one-input switches directly coupled to said one or more lower order digital output lines and to selected ones of said first and second complementary outputs, and a plurality of said two-input switches directly coupled to said one or more lower order digital output lines and to selected ones of said first and second complementary outputs.

4. The circuit of claim 1, wherein said one- and two-input switches comprise N-type and P-type Complementary Metal Oxide Silicon transistors.

5. A method for converting an analog input voltage signal to a digital signal representing the digital equivalent of the analog input voltage signal, comprising the steps of:

generating a unique set of voltages;

comparing the unique set of voltages to the analog input voltage signal;

producing a thermometer code based on said comparison; and applying said thermometer code directly to a decode circuit of one-input switches and two-input switches, said switches of both types connected to a plurality of output lines, wherein a numerical characteristic of digital numbering systems is exploited by said decode circuit, such that the digital equivalent of the analog input signal is generated at the output lines faster and more efficiently than with conventional circuits, wherein said decode circuit utilizes not more than about $$\sum_{k=0}^{N-2} (2^{(N-k+1)} - 2).$$

transistors, where N is the total number of said digital output lines and k is the order of said digital output lines.

* * * * *